(12) United States Patent
Vanderhoek et al.

(10) Patent No.: US 7,716,623 B1
(45) Date of Patent: May 11, 2010

(54) PROGRAMMABLE LOGIC DEVICE ARCHITECTURES AND METHODS FOR IMPLEMENTING LOGIC IN THOSE ARCHITECTURES

(75) Inventors: Tim Vanderhoek, Toronto (CA); Vaughn Betz, Toronto (CA); David Cashman, Toronto (CA); David Lewis, Toronto (CA); Michael Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/580,038

(22) Filed: Oct. 15, 2009

Related U.S. Application Data

(62) Division of application No. 11/356,762, filed on Feb. 16, 2006, now Pat. No. 7,619,443.

(51) Int. Cl.
*H03K 17/693* (2006.01)
(52) U.S. Cl. .................................. 716/16; 716/2; 716/9
(58) Field of Classification Search ............. 326/37–41; 716/2–8, 12–18
See application file for complete search history.

(56) References Cited

U.S. PATENT DOCUMENTS

| 5,260,611 | A | 11/1993 | Cliff et al. | |
|---|---|---|---|---|
| 5,592,106 | A | 1/1997 | Leong et al. | |
| 5,689,195 | A | 11/1997 | Cliff et al. | |
| 5,963,049 | A * | 10/1999 | Cliff et al. | 326/41 |
| 5,977,793 | A * | 11/1999 | Reddy et al. | 326/41 |
| 6,727,727 | B2 | 4/2004 | Schleicher et al. | |
| 6,957,412 | B1 * | 10/2005 | Betz et al. | 716/16 |
| 6,971,083 | B1 * | 11/2005 | Farrugia et al. | 716/17 |
| 7,176,718 | B1 | 2/2007 | Hutton et al. | |
| 7,253,658 | B1 | 8/2007 | Young | |

OTHER PUBLICATIONS

V. Betz et al., *Architecture and CAD for Deep-Submicron FPGAs*, Kluwer Academic Publishers, Boston, 1999, pp. 37-50.

* cited by examiner

*Primary Examiner*—James H. Cho
*Assistant Examiner*—Christopher Lo
(74) *Attorney, Agent, or Firm*—Ropes & Gray LLP; Robert R. Jackson

(57) ABSTRACT

A programmable logic device ("PLD") architecture includes logic elements ("LEs") grouped together in clusters called logic array blocks (LABs"). To save area, local feedback resources (for feeding outputs of the LEs in a LAB back to inputs of LEs in the LAB) are reduced or eliminated as compared to in the prior art. Because all (or at least more) of any LE-output-to-LE-input connections of LEs that are working together in a LAB must be routed through the general-purpose input routing resources of the LAB, it is important to conserve those resources. This is accomplished, for example, by giving greater importance to finding logic functions that have common inputs when deciding what logic functions to implement together in a LAB.

8 Claims, 9 Drawing Sheets

FOR EACH NET ATTACHED TO THE LOGIC FUNCTION

IF THE NET HAS ANY TERMINALS
    THAT ARE PART OF THE CURRENT
    CLUSTER

LET A = NUMBER OF TERMINALS
        ON THE NET THAT WOULD
        REMAIN OUTSIDE OF THE
        CURRENT CLUSTER IF THE
        CURRENT LOGIC FUNCTION WERE
        ADDED TO THE CLUSTER

INCREMENT THE GAIN FOR
        THE CURRENT LOGIC FUNCTION
        BY 1/A

*FIG. 7*
(PRIOR ART)

FOR EACH NET ATTACHED TO THE LOGIC FUNCTION

REMOVE FROM THE LOGIC FUNCTION ANY PIN SHARING GAIN THAT WAS PREVIOUSLY APPLIED DUE TO THIS NET

IF THE NET HAS ANY TERMINALS THAT ARE PART OF THE CURRENT CLUSTER

LET A = NUMBER OF TERMINALS ON THE NET THAT WOULD REMAIN OUTSIDE OF THE CURRENT CLUSTER IF THE CURRENT LOGIC FUNCTION WERE ADDED TO THE CLUSTER

IF THE NET IS ATTACHED TO AN INPUT PIN (AS OPPOSED TO AN OUTPUT PIN) OF THE CURRENT LOGIC FUNCTION, THEN

INCREMENT THE GAIN FOR THE CURRENT LOGIC FUNCTION BY P/A

IF THE NET IS ATTACHED TO AN OUTPUT PIN, THEN

INCREMENT THE GAIN FOR THE CURRENT LOGIC FUNCTION BY 1/A

FIG. 8

FOR EACH LOGIC FUNCTION THAT IS A TERMINAL
ON ANY NET CONNECTED TO THE CURRENT CLUSTER

REMOVE FROM THE LOGIC FUNCTION ANY
   PIN USAGE GAIN THAT WAS PREVIOUSLY GIVEN TO
   THE LOGIC FUNCTION

LET L = MAXIMUM NUMBER OF LAB INPUTS ALLOWED PER CLUSTER
   LET I = NUMBER OF LAB INPUTS CURRENTLY REQUIRED BY THE CLUSTER
   LET B = NUMBER OF LEs IN THE CURRENT CLUSTER THAT HAVE NOT YET
   BEEN ALLOCATED TO A LOGIC FUNCTION
   LET C = NUMBER OF LOGIC FUNCTIONS THAT ARE PART OF THE CLIQUE TO
   WHICH THE CURRENT LOGIC FUNCTION BELONGS; THIS MUST BE NO LESS
   THAN 1

LET E = $\frac{L-I}{B} \times C$

LET T = MAXIMUM NUMBER OF LOGIC FUNCTIONS THAT MAY BE
   ASSIGNED TO A CLUSTER

LET D = $\left(\frac{E}{L \div T}\right)^{P2}$

LET N = TOTAL NUMBER OF ADDITIONAL LAB INPUTS THAT WILL BE
   REQUIRED IF THE LOGIC FUNCTION IS ADDED TO THE CURRENT CLUSTER
   (INCLUDING INPUTS REQUIRED BY OTHER LOGIC FUNCTIONS IN THE SAME
   CLIQUE)

IF B ≠ C, THEN LET G = $\left(\frac{P3}{D}\right) \times \left(\frac{E-N}{B-C}\right)^{P4}$ IF B = C, THEN LET G BE A VERY LARGE NUMBER
   IF (E - N > 0) THEN INCREASE THE GAIN FOR THE CURRENT LOGIC
   FUNCTION BY G
   IF (E - N < 0) THEN DECREASE THE GAIN FOR THE CURRENT LOGIC
   FUNCTION BY G

PROGRAMMABLE LOGIC DEVICE ARCHITECTURES AND METHODS FOR IMPLEMENTING LOGIC IN THOSE ARCHITECTURES

This is a division of application Ser. No. 11/356,762, filed Feb. 16, 2006 now U.S. Pat. No. 7,619,443, which is hereby incorporated by reference herein in its entirety.

BACKGROUND OF THE INVENTION

This invention relates to programmable logic device ("PLD") integrated circuits and other devices of that general type (all referred to generically herein as PLDs). More particularly, the invention relates to certain aspects of the organization ("architecture") of the circuitry of a PLD, and to methods for implementing a user's logic design in such PLD architectures.

PLDs are known that have logic elements ("LEs") grouped in clusters that are sometimes referred to as logic array blocks or LABs. An example of this type of PLD architecture is shown in Cliff et al. U.S. Pat. No. 5,260,611. In this type of architecture, each LE has a local feedback connection from its output to inputs of all the logic elements in the LAB that includes that LE. Each LE can also output to the general interconnection resources of the PLD. Each LE can get its inputs from the associated local feedback connections and/or from the general interconnection resources.

Dedicated local feedback connections have a number of advantages such as speed. However, they do consume substantial resources of the PLD (e.g., space on the PLD). More efficient PLD architectures are always being sought.

SUMMARY OF THE INVENTION

In accordance with certain aspects of the invention, a programmable logic device includes a plurality of logic array blocks ("LABs"), each of which includes a plurality of logic elements ("LEs") and a plurality of LAB line circuits. Each LAB line circuit can select a LAB line signal from any of a plurality of signal sources and makes the LAB line signal available for selection as an input to any of the LEs in the LAB that includes that LAB line circuit. Each LAB may be without local feedback lines that are dedicated to making an output signal of an LE in the LAB available for selection as an input to any of the LEs in that LAB without passing through a LAB line circuit of the LAB. However, each LAB may include dedicated connections from outputs of LEs in the LAB to inputs of the LAB line circuits of the LAB.

As an alternative, each LAB may include a local feedback line associated with each LE in only a subplurality of the LEs in the LAB. For example, this subplurality may consist of approximately 50% of the LEs in each LAB. Each such local feedback line makes the output signal of the associated LE available for selection as an input to any of the LEs in the LAB that includes that local feedback line.

As another alternative, each LAB may include a plurality of local feedback circuits, each of which can select a local feedback signal from outputs of any one of only a subplurality of the LEs in the LAB that includes that local feedback circuit. Each subplurality may consist of two LEs. Again, each local feedback circuit makes its local feedback signal available for selection as an input to any of the LEs in the LAB that includes that local feedback circuit.

Other aspects of the invention relate to computer-aided design ("CAD") methods that are useful for selecting logic functions for implementing in a LAB that has a reduced number of local feedback lines or even no local feedback lines. An example of such a CAD method includes (1) selecting a seed logic function to initiate the formation of a cluster of logic functions for implementation in the LAB, (2) identifying each remaining logic function that is attached to a net that has at least one terminal that is part of the cluster, (3) for each such identified logic function, computing a value of gain that can be achieved by adding the identified logic function to the cluster, the gain value being incremented by a greater amount if the net is attached to an input of the identified logic function than if the net is attached to an output of that function, and (4) using relative values of the gain as part of a process for selecting one of the remaining logic functions for addition to the cluster.

Another CAD method example includes (1) seed logic function selection as in the previous example, (2) identifying each remaining logic function that is a terminal on any net connected to the cluster, (3) for each such identified logic function, computing a value of gain that can be achieved by adding that logic function to the cluster, the gain value being increased for a logic function with relatively more inputs that are shared with the cluster, and the gain value being decreased for a logic function with relatively more inputs that are not shared with the cluster, and (4) using relative values of the gain as part of a process for selecting one of the remaining logic functions for addition to the cluster.

Further features of the invention, its nature and various advantages, will be more apparent from the accompanying drawings and the following detailed description.

BRIEF DESCRIPTION OF THE DRAWINGS

FIG. 7 is a simplified pseudo-code specification for an illustrative embodiment of a portion of what is shown in FIG. 5.

FIG. 8 is a simplified pseudo-code specification for an illustrative embodiment of a portion of what is shown in FIG. 6 in accordance with the invention.

FIG. 9 is a simplified pseudo-code specification for an illustrative embodiment of another portion of what is shown in FIG. 6 in accordance with the invention.

DETAILED DESCRIPTION

Figure 1:
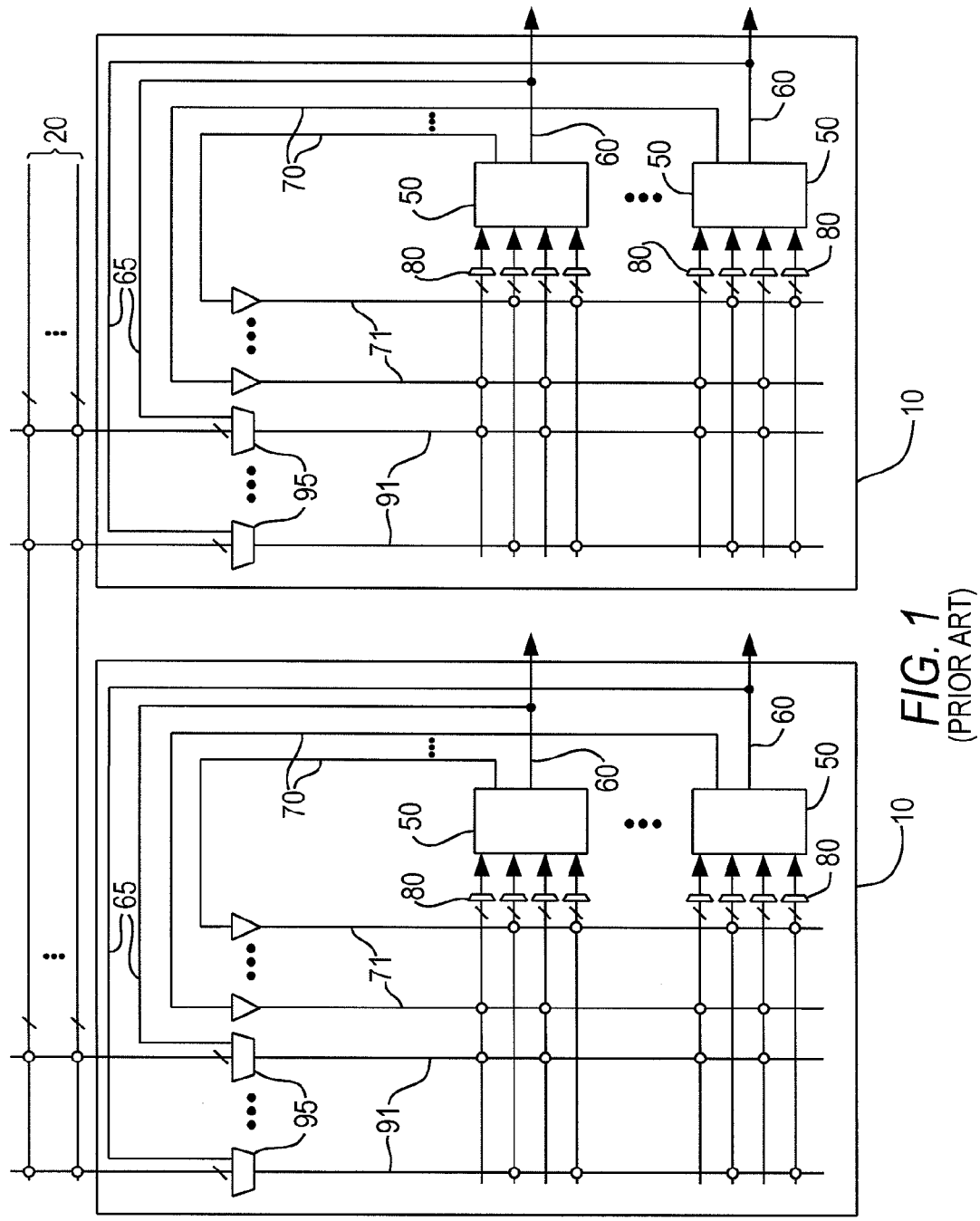
FIG. 1 is a simplified schematic block diagram of a representative portion of a known PLD architecture.

A representative portion of a known PLD architecture is shown in FIG. 1. As shown in this FIG., a PLD includes many LEs 50 that are clustered together in many LABs 10. For example, there may be 16 LEs 50 in each LAB 10. Each LE 50 may be circuitry that is programmable (configurable) to provide an output signal that is any logical combination of four primary inputs to the LE. An LE 50 may also include a register that is selectively usable to register the combinational result prior to outputting that result.

Each LE 50 can feed an LE output signal back to dedicated local feedback conductors that serve the LEs in the LAB 10 that includes that LE. Elements 70 and 71 in FIG. 1 provide these dedicated local feedback paths. Each LE 50 can alternatively or additionally apply an output signal to more general interconnection resources of the PLD. Elements 60 are these LE outputs, and they may go to global routing 20 of the PLD and/or to so-called "sneak" connections 65 back into relatively general-purpose input resources 95/91 of the LAB 10 that includes the LE originating the signal 60.

So-called LAB lines 91 are associated with each LAB 10. Programmably controllable multiplexers or programmable logic connectors ("PLCs") 95 select the signals on LAB lines 91 from global routing 20 of the PLD and/or from sneak connections 65 (if such sneak connections are provided). (The small circles at the intersections of conductors 20 and input conductors to PLCs 95 indicate that there are programmably selectable connections between those conductors. The population density of such connections may be less than 100%.)

PLCs 80 associated with each LE 50 select the primary inputs to that LE. For example, a PLC 80 may get an LE input from any of a subset of the local feedback conductors 71 and LAB lines 91 of the LAB that includes that LE and PLC. The small circles at the conductor intersections to the left of a PLC 80 indicate generally which of the associated conductors 71 and 91 that PLC 80 can select its output signal from. For example, these small circles may have a 50% population density, meaning that a PLC 80 can select its output signal from any of 50% of the adjacent local feedback conductors 71 and any of 50% of the adjacent LAB lines 91.

The population densities, LAB sizes, number of LE inputs, etc., mentioned in the preceding discussion are only illustrative, and these parameters can have other values in other embodiments of the invention.

Note that sneak connections 65 provide for direct connection from LE outputs 60 to LAB lines 91 through PLCs 95. These sneak connections are useful when the local line 71 to PLC 80 connections are not 100% populated, because then a sneak connection may feed a LAB line 91 that connects to an LE input 80 that is not otherwise accessible via a local line 71 carrying the same signal as the sneak connection. A sneak connection is typically slower than a local line 71, but faster than global routing 20.

Although current PLD LAB structures may vary from that shown in FIG. 1, the present invention will operate correctly for any generally LAB-based architecture.

Figure 2:
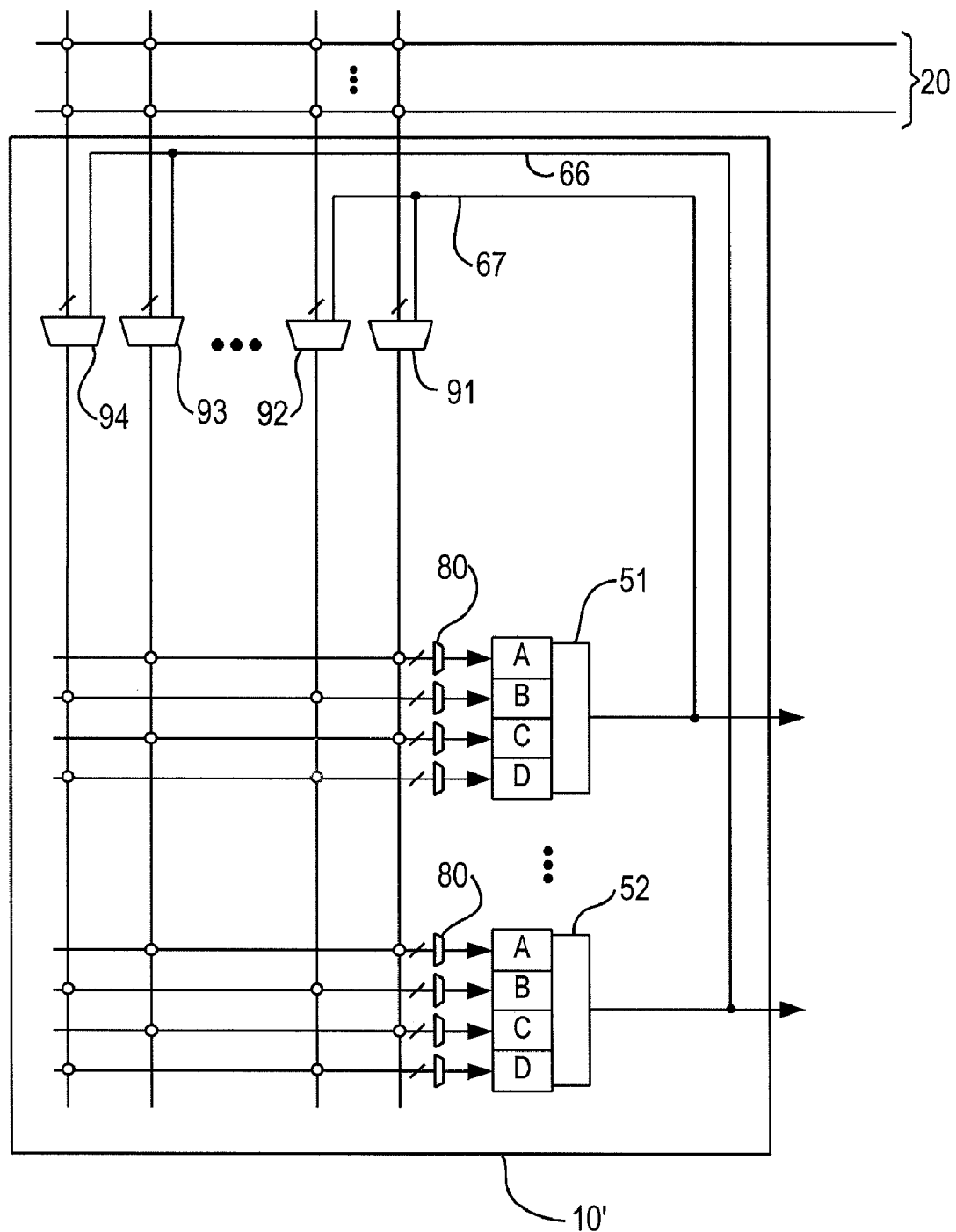
FIG. 2 is a simplified schematic block diagram of a representative portion of an illustrative embodiment of a PLD architecture in accordance with the invention.

FIG. 2 shows a representative LAB 10' built according to this invention. The local lines are removed (as compared to FIG. 1). In other words, FIG. 2 does not include circuit paths like 70/71 in FIG. 1. The sneak connection 66, 67 associated with each LE 51, 52 connects to two PLCs 91/92 or 93/94 driving the LAB lines. Each sneak connection preferably connects to two PLCs because of the 50% connectivity into the LE input PLCs 80. For example, the LAB line driven by PLC 94 only connects to the B and D inputs of each LE. To ensure that LE 52 can feed back to the A and C inputs, sneak connection 66 also inputs to PLC 93. If the LAB-line-to-LE-input population is less than 50%, then it may be desirable for sneak connection 66 to have inputs to more than PLCs 93 and 94. Conversely, if the LAB line to LE input population is 100%, then sneak connection 66 could have input to only a single LAB line input PLC.

A LAB 10' built according to this invention typically has a greater number of LAB lines (e.g., outputs of PLCs 91-94 in FIG. 2) and PLCs (like 91-94 in FIG. 2) driving those LAB lines than a LAB 10 built according to the prior art. A typical prior art LAB 10 might have 16 LEs and 38 LAB lines. A comparably sized LAB 10' according to this invention might have between 44 and 48 LAB lines. The number of LAB lines may vary, depending on the global routing architecture and the physical layout constraints. However, it will generally be a greater number than for prior art LABs 10.

LABs 10' built according to the invention require less area for a given logic capacity due to the reduced fan-in to LE inputs 80. For a given population density (typically 50%) of LAB and local line connectivity to LE inputs 80, the area required to build the LE inputs 80 is quadratic in relation to the number of LEs within a LAB. Thus the invention will be more beneficial for LABs containing a greater number of LEs 50. In addition, the removal of the local line drivers in FIG. 2 as compared to FIG. 1 further reduces the required area.

Because reducing interconnect delay is typically an important goal of PLD architecture design, and because local feedback connections within a LAB are very frequent, it is often advantageous to bias the sneak connections into PLCs 91-94 to be faster than connections from global routing 20, although at the expense of some area. If these PLCs are implemented as two-stage multiplexers, then sneak connections like 66 and 67 may enter the second stages of these muxes.

It may not be necessary for each sneak connection like 66 and 67 to have a fast input to each PLC 91-94. Often the LE inputs are skewed such that one input (e.g., the D input) has the least delay and is used most frequently for critical connections. Because of this, using fast sneak inputs to PLCs like 92 and 94 will give greater benefit than using fast sneak inputs to PLCs like 91 and 93.

A modern computer aided design ("CAD") system (used for determining how to place a user's logic design on a PLD in order to implement that design in the PLD) is usually able to automatically identify which logic functions in a LAB require fast feedback connections and place those logic functions into LEs that have fast feedback connections. Because of this, providing fast sneak inputs for only some of the sneak connections will give a better area-to-delay trade-off than providing fast sneak inputs for all of the sneak connections. In FIG. 2, sneak connection 67, for example, may have only slow inputs to PLCs 91 and 92, but sneak connection 66 may have a fast input to PLC 94. A modern CAD system will automatically identify this from the delays used to describe routing connectivity, and will place a logic function requiring a fast feedback connection into LE 52 rather than LE 51.

The number and locations of the fast sneak inputs in a given embodiment of the invention will depend on the area/cost and delay goals of the architecture.

Figure 3:
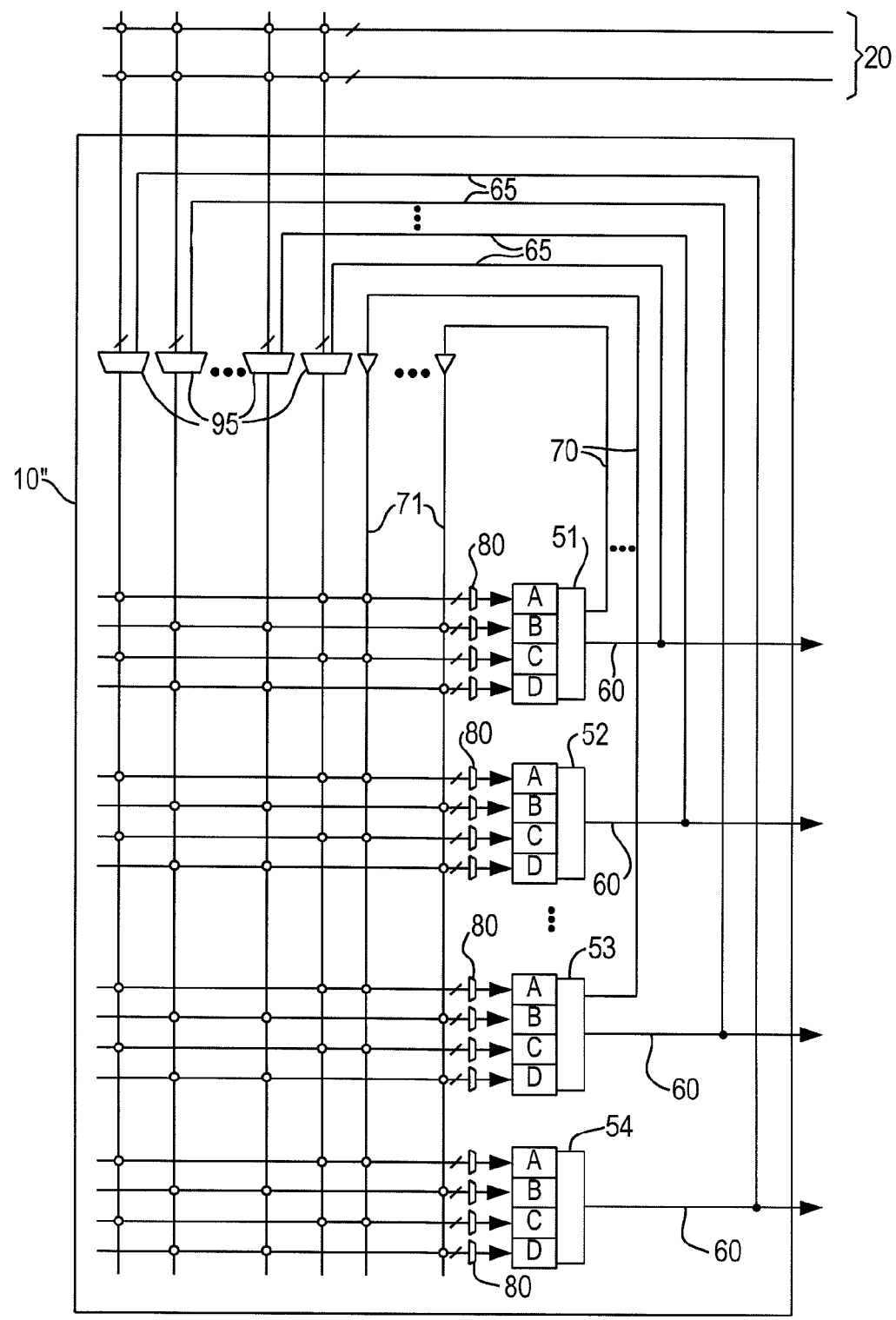
FIG. 3 is a simplified schematic block diagram of a representative portion of another illustrative embodiment of a PLD architecture in accordance with the invention.

FIG. 3 shows a variation of the invention in which a LAB 10" is built with a partial complement of local lines 70/71. In this embodiment of the invention, every other LE is given a local line 71. LEs 52 and 54 do not have a local line and have only a single sneak connection to PLC 95 connections. Accordingly, LE 52 can only feed back to the B and D LE inputs, while LE 54 can only feed back to the A and C LE inputs. If LE 52 or LE 54 must connect to another LE input, then it must use global routing that typically has a greater delay penalty relative to using a sneak connection. Because of this, the CAD system must be careful to ensure that logic functions implemented using LEs 52 and 54 do not require a fast feedback connection to one of the LE inputs that is unavailable to them via a sneak connection. An embodiment of the invention that is less dependent on an intelligent CAD system provides LEs 52 and 54 with two sneak connections to PLCs 95 such that such LEs are able to feed back to any LE input A, B, C, or D.

Relative to the embodiment in FIG. 2, the FIG. 3 embodiment typically does not eliminate as much area cost. However, the FIG. 3 embodiment has the advantage that the local lines 70/71 are still available for logic functions that need the fastest possible feedback connections. The CAD system must be intelligent enough to place logic functions requiring fast feedback connections into LEs like 51 and 53 that have access to a local line. This is generally possible for a modern CAD system.

Throughout this specification, the use of four-input LEs is only illustrative. The invention may be as easily used with other types of LEs or even with a heterogeneous mixture of LEs within a LAB. The use of 50% population from the LAB lines and local lines to the LE inputs is similarly only illustrative. With reference to FIG. 3 again, it is noted that the number of local lines can be further reduced at the expense of greater stress on the CAD system in order to achieve a given target speed.

Figure 4:
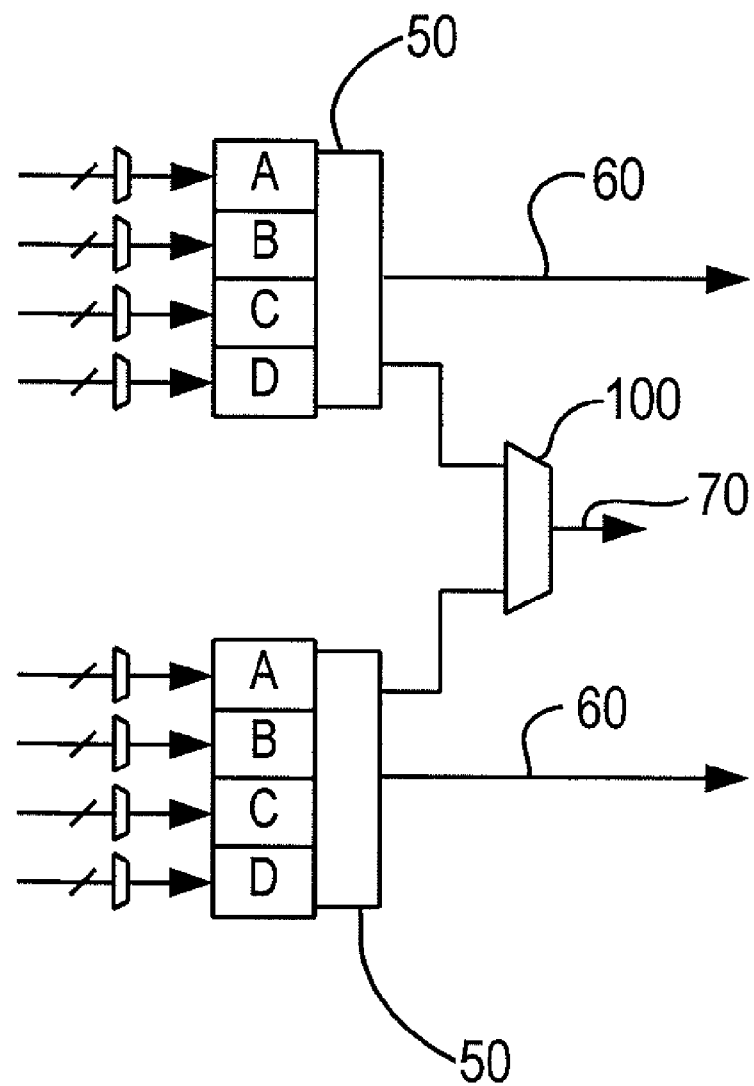
FIG. 4 is a simplified schematic block diagram of a representative portion of still another illustrative embodiment of a PLD architecture in accordance with the invention.

FIG. 4 depicts a representative part of yet another possible variation of the invention. In this variation, the number of local lines 70 provided per LAB can be one-half the number of LEs 50 in a LAB. However, each local line 70 is shared by two LEs 50 through a PLC 100. Although the total number of fast local line feedback connections is the same as in the FIG. 3 embodiment, the requirement for an intelligent CAD system is relaxed because the CAD system no longer needs to ensure that logic functions requiring a fast feedback connection are placed into LEs that have access to a local line.

It will be appreciated that the number of local lines 70 can be reduced further from one-half the number of LEs. Similarly, the fan-in to a PLC 100 can be increased to ensure that all LEs continue to have access to a local line. The LEs 50 in a LAB whose outputs are connected to each of the PLCs 100 in the LAB may be in mutually exclusive (i.e., non-overlapping) subpluralities of the LEs if desired. These subpluralities may also be collectively exhaustive of all the LEs 50 in the LAB if desired.

Another possible aspect of the invention relates to CAD system modifications that can be used to more efficiently implement logic circuits (e.g., a user's logic design) on PLDs with LABs built without local lines.

The CAD system is responsible for partitioning the many logic functions required to describe a logic circuit into smaller clusters of logic functions, where each cluster can be implemented in a single LAB. It is assumed in this discussion that each logic function has already been mapped to a form that can be implemented in a single LE (or in some architectures two LEs aggregated together). A key goal of clustering is to minimize the total number of LABs required to implement each logic circuit, because this corresponds to reducing the area and thus the cost of implementing the circuit on a PLD. Although modern CAD systems are able to automatically adapt and target LABs that contain varying numbers of inputs, outputs, and local lines, they tend not to adapt well to LABs built according to this invention (i.e., without local lines or with greatly reduced numbers of local lines). Without more sophisticated CAD capabilities, the average number of LABs required to implement a logic circuit can increase by as much as 10%, thereby eliminating any benefit derived from reducing the area required for each LAB by removing the local lines.

Figure 5:
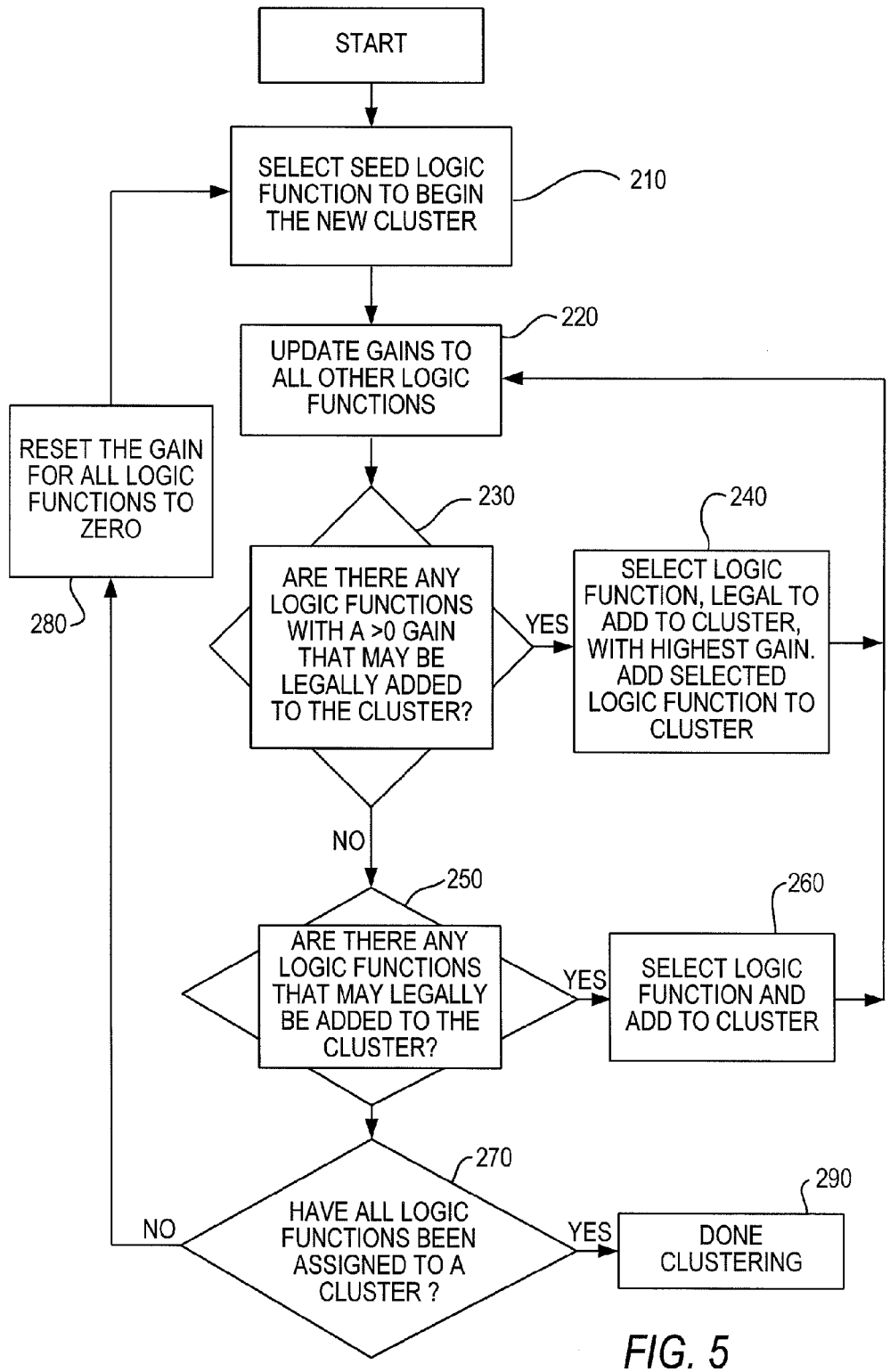
FIG. 5 is a simplified flow chart of an illustrative method for implementing logic functions in a PLD.

FIG. 5 shows an example of clustering flow according to the prior art. Clusters are created one by one, with each cluster being completed before the next cluster is started. To begin a cluster, a seed logic function is selected and added to the new cluster (step 210). Once the seed is added to the cluster, a numerical "gain" is computed for all logic functions that have not yet been assigned to any cluster (step 220). The algorithm uses the gain to select which additional logic function(s) should be added to the cluster. Typically the gain is computed such that related logic functions are grouped within the same LAB to help the circuit meet timing requirements and reduce congestion on the global routing network. After gains have been updated (step 220), the algorithm searches for the logic function with the highest gain that may legally be added to the cluster (steps 230 and 240). ("Legally" may refer to any absolute limit of the LAB. For example, a logic function that will require more new LAB inputs than remain available in the LAB cannot be legally added to the LAB.) If no logic functions with positive gain can be added to the cluster, then the algorithm searches for some other logic function that may be legally added to the cluster (step 250). If a logic function is found, it is added to the cluster (step 260), the gains are updated (step 220), and the algorithm repeats and tries to add yet another logic function to the cluster. If no more logic functions can be legally added to the cluster, then the current cluster is finished, and a new cluster is started via steps 270, 280, and 210. The algorithm finishes once all logic functions have been assigned to a cluster (step 290).

It should be noted that, at any time, selecting a single logic function to add to the cluster may imply that other logic functions must also be added to maintain legality. A group of logic functions that must be added simultaneously to a cluster will be called a "clique" in this disclosure. The algorithm is not changed due to the possible existence of cliques.

Figure 6:
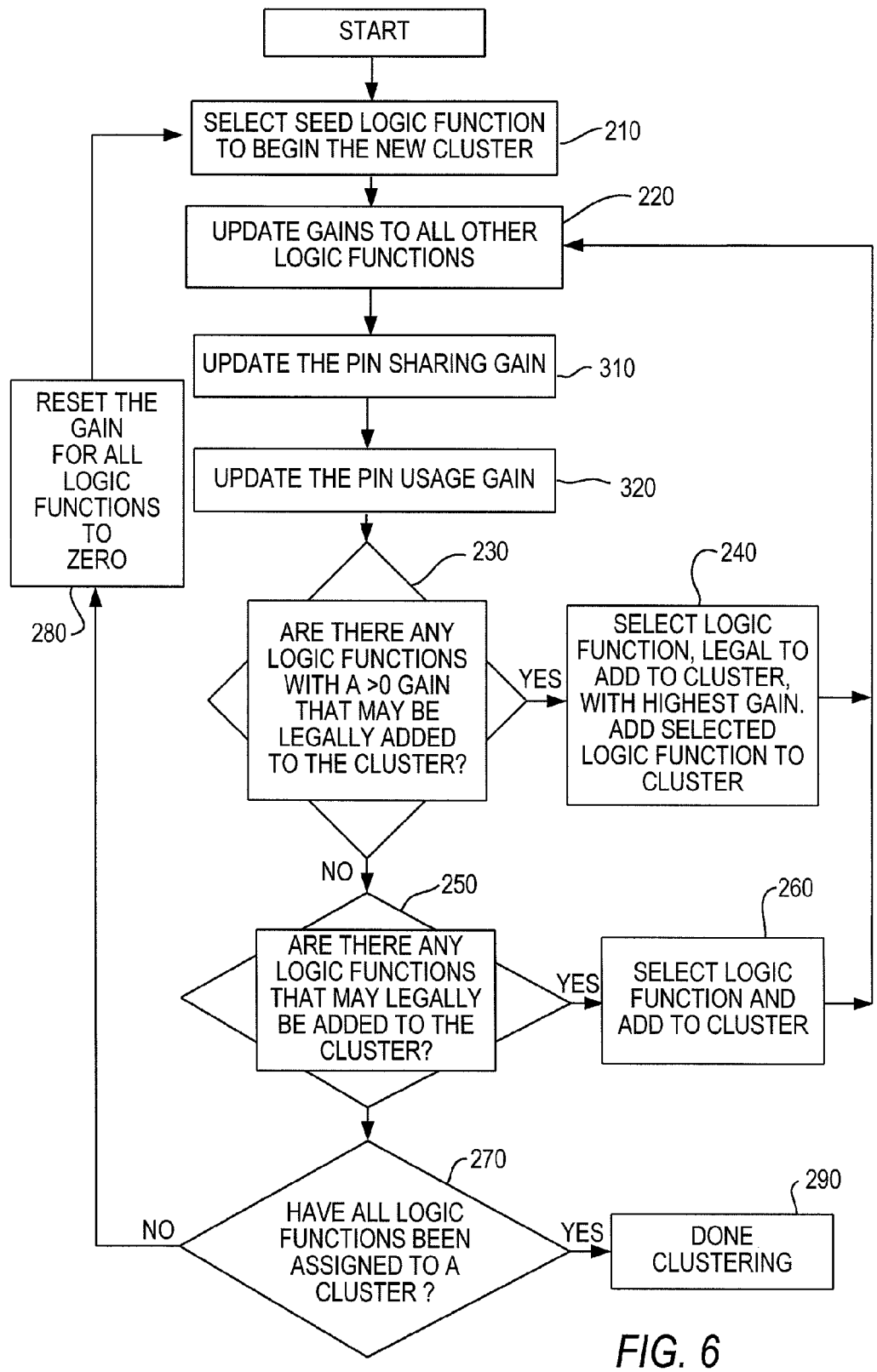
FIG. 6 is a simplified flow chart showing an illustrative embodiment of modifications of the FIG. 5 method in accordance with the invention.

FIG. 6 shows an illustrative embodiment of modification of a FIG. 5 type flow in accordance with this invention. FIG. 6 shows an enhancement to the clustering algorithm after the gain computation (step 220) that enables the CAD system to effectively target LABs built without local lines (or with greatly reduced local line resources). Two additional steps (310 and 320) have been added after the gains have been computed according to prior art.

As shown in FIG. 6, the first additional step (310) is to update the pin sharing gain. The pin sharing gain may be part of prior art gain computations, but (as will be seen) it is computed differently in accordance with this invention. Typically in the prior art the pin sharing gain is calculated for every logic function that drives or is driven by a net, where one or more of the terminals on the net is part of the current cluster. Pseudo-code in FIG. 7 shows how the pin sharing gain may be calculated for a given logic function in the prior art.

In contrast to FIG. 7, the present invention includes increasing the value of the pin sharing gain if a net is an input to the given logic function. FIG. 8 shows an example of pseudo-code for weighting pin sharing gain more strongly for input pins.

In FIG. 8 the numerical parameter P specifies how strongly the pin sharing gain biases toward grouping input pins together in a LAB. P should be greater than 1, and its exact value can be tuned for a specific architecture and CAD system. As an example, P may be in the range from about 2 to about 5. It is not necessary for P to be a constant. The point is that pin sharing gain is weighted more strongly for input pins. Recall that a no-locals LAB is typically given more LAB line circuits (like 91/95 in FIG. 1) than a with-locals LAB. As one adds an increasing number of additional LAB line circuits to the no-locals LAB, one will generally use a less aggressive value (i.e., a smaller value) of parameter P.

Note in connection with FIG. 8 that pin sharing gain can be incremented by P/A and/or by 1/A more than once. This will happen when a logic function is connected to multiple nets that are sourced/sinked by the cluster.

After computing the modified pin sharing gain (step 310; FIG. 6), FIG. 6 shows that the pin usage gain is computed (step 320). The pin usage gain does not exist in the prior art. The pin usage gain applies a positive or negative gain to each logic function based on the number of additional LAB inputs that logic function would require if the logic function were added to the current cluster. If the logic function requires a large number of nets that are not already available in the current cluster, and if the cluster is running out of available LAB inputs, then pin usage will apply a negative gain to the logic function. Conversely, if a logic function requires relatively few additional LAB inputs, then pin usage will apply a positive gain.

One possible embodiment of the pin usage gain is shown in the pseudo-code in FIG. 9.

The numerical parameters P2, P3, and P4 in FIG. 9 may be tuned to the specific PLD architecture and CAD system. The numerical values of P2, P3, and P4 may vary as the cluster is filled, or they may be held constant. Typical values of P2 are in the range from about 0 to about 8. A typical value for P3 is about 5. A typical value for P4 is about 1. Both parameters P and P3 will be dependent on the desired magnitude of clustering gains other than pin sharing and pin usage gains.

Note that the value of L (the maximum number of LAB inputs allowed by the algorithm) may be less than the physical number of LAB inputs to increase routability of the clusters.

In FIG. 9, the value of E is an estimate of the number of LAB input pins that are available to be used by the current logic function, given that the algorithm is trying to cluster the whole logic circuit into as few clusters as possible. The value of D is meant to indicate whether the current cluster (given logic functions that have already been assigned to it) is using fewer LAB inputs than expected or more LAB inputs than expected. D is greater than 1 in the former case and less than 1 in the latter case. D is then used as a divisor when calculating the gain G, with the effect that the magnitude of G is only significant if the current cluster appears to be using up its available LAB inputs too quickly. The intent of G is simply to give a positive gain to logic functions that require fewer LAB inputs than expected, and a negative gain to logic functions that require more LAB inputs than expected.

It is not necessary for G or D to be calculated using an exponential function. As described in the FIG. 9 pseudo-code, the magnitude of G will generally increase as the cluster approaches full capacity (i.e., the value of B-C decreases), provided that P2, P3, and P4 are constant. Because the intent of G is to conserve the available LAB inputs, and because conservation of available LAB inputs becomes less important as the cluster is filled, it may be advantageous to force the magnitude of G to decrease once a certain number of logic functions have been added to the cluster.

In general, the above pseudo-code (e.g., as in FIG. 9) may be adjusted as long as the important aspects of the pin usage gain are retained. In particular, logic functions that require relatively few additional LAB inputs should be given a higher gain than logic functions that require more additional LAB inputs.

It will be apparent that both the pin sharing gain and the pin usage gain can be employed as part of a clustering algorithm that does not generate clusters one at a time. For example, some clustering algorithms generate multiple clusters simultaneously. As long as the clustering algorithm uses some type of gain or cost to choose which logic functions to add to each cluster, then the pin sharing gain and the pin usage gain can be employed as described above.

A PLD constructed according to the invention using LABs with either no local lines or a reduced number of local lines will require less area to implement logic circuits of a given size. If the number of local lines per LAB is dramatically reduced (typically beyond 50%), or if the local lines are removed altogether, then CAD system modifications like those described above will help ensure that the clustering algorithm is able to efficiently target the architecture.

It will be apparent that the foregoing is only illustrative of the principles of the invention, and that various modifications can be made by those skilled in the art without departing from the scope and spirit of the invention. For example, the number of LEs in a LAB can be larger or smaller than in the illustrative embodiments that have been shown and described. An example of how any of the PLCs shown herein may be implemented is as a multiplexer ("mux") circuit with programmable control of the input signal selection made by the mux.

The invention claimed is:

1. A method of selecting logic functions for implementation in a logic array block that includes (1) a plurality of logic elements, each of which is capable of performing one of the logic functions, and (2) a plurality of LAB line circuits, each of which is capable of selecting a LAB line signal from a plurality of signal sources and making that LAB line signal available for selection as an input to any of the logic elements, the method comprising:
   selecting a seed logic function to initiate the formation of a cluster of logic functions for implementation in the logic array block;
   identifying each remaining logic function that is attached to a net that has at least one terminal that is part of the cluster;
   for each logic function identified in the identifying, computing a value of gain that can be achieved by adding the identified logic function to the cluster, the gain value being incremented by a greater amount if the net is attached to an input of the identified logic function than if the net is attached to an output of that function; and
   using relative values of the gain as part of a process for selecting one of the remaining logic functions for addition to the cluster.

2. The method defined in claim 1 wherein the gain value is incremented by P/A if the net is attached to an input of the identified logic function or by 1/A if the net is attached to an output of the identified logic function, where A is the number of terminals on the net that would remain outside the cluster if the identified logic function were added to the cluster, and where P is greater than 1.

3. The method defined in claim 1 wherein the computing further includes:
   increasing the gain value for an identified logic function with relatively more inputs that are shared with the cluster.

4. The method defined in claim 3 wherein the computing still further includes:
   decreasing the gain value for an identified logic function with relatively more inputs that are not shared with the cluster.

5. The method defined in claim 1 wherein the using comprises:
   determining which of the identified logic functions has the highest gain value, and adding that logic function to the cluster.

6. The method defined in claim 1 wherein the using comprises:
   determining which of the identified logic functions has the highest gain value;

testing the logic function identified in the determining for legality to add to the cluster; and if the testing reveals that the logic function is legal, then adding that logic function to the cluster.

7. A method of selecting logic functions for implementation in a logic array block that includes (1) a plurality of logic elements, each of which is capable of performing one of the logic functions, and (2) a plurality of LAB line circuits, each of which is capable of selecting a LAB line signal from a plurality of signal sources and making that LAB line signal available for selection as an input to any of the logic elements, the method comprising:

selecting a seed logic function to initiate the formation of a cluster of logic functions for implementation in the logic array block;

identifying each remaining logic function that is a terminal on any net connected to the cluster;

for each logic function identified in the identifying, computing a value of gain that can be achieved by adding the identified logic function to the cluster, the gain value being increased for an identified logic function with relatively more inputs that are shared with the cluster, and the gain value being decreased for an identified logic function with relatively more inputs that are not shared with the cluster; and using relative values of the gain as part of a process for selecting one of the remaining logic functions for addition to the cluster.

8. The method defined in claim 7 wherein the using comprises:

determining which of the identified logic functions has the highest gain value, and adding that logic function to the cluster.

* * * * *